(12) United States Patent
Daniels et al.

(10) Patent No.: US 6,303,978 B1
(45) Date of Patent: Oct. 16, 2001

(54) OPTICAL SEMICONDUCTOR COMPONENT AND METHOD OF MANUFACTURE

(75) Inventors: Dwight L. Daniels, Mesa; Treliant Fang, Chandler; Athena M. Parmenter, Fountain Hills, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/627,029

(22) Filed: Jul. 27, 2000

(51) Int. Cl.[7] ............................ H01L 23/58; H01L 23/02; H01L 23/14; H01L 23/29
(52) U.S. Cl. ............................ 257/642; 257/643; 257/680; 257/702; 257/792; 257/795; 438/116
(58) Field of Search ............................ 257/680, 702, 257/792, 795, 642, 643; 438/116

(56) References Cited

U.S. PATENT DOCUMENTS

| | | | | |
|---|---|---|---|---|
| 4,276,141 | * | 6/1981 | Hawkins | 204/195 M |
| 4,923,678 | | 5/1990 | Benedikt et al. | 428/209 |
| 5,973,337 | | 10/1999 | Knapp et al. | 257/99 |
| 6,060,664 | * | 5/2000 | Tanahashi et al. | 174/125.1 |

* cited by examiner

Primary Examiner—Ngân V. Ngô
(74) Attorney, Agent, or Firm—Patricia S. Goddard

(57) ABSTRACT

An optical semiconductor component includes a semiconductor substrate (120) and a packaging material (140) located over the semiconductor substrate. The packaging material includes an optically transparent cycloaliphatic polymer (142, 242, 400, 600). A method of manufacturing the component includes mixing a monomer (300, 500) of the polymer with a catalyst to form the packaging material, filtering the packaging material, applying the packaging material, and curing the packaging material.

29 Claims, 2 Drawing Sheets

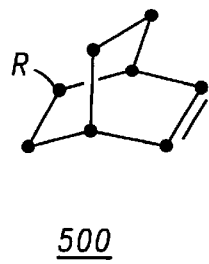
500
FIG. 5
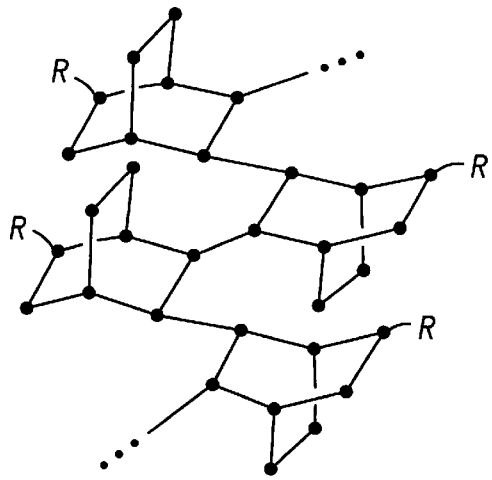
600
FIG. 6
FIG. 7
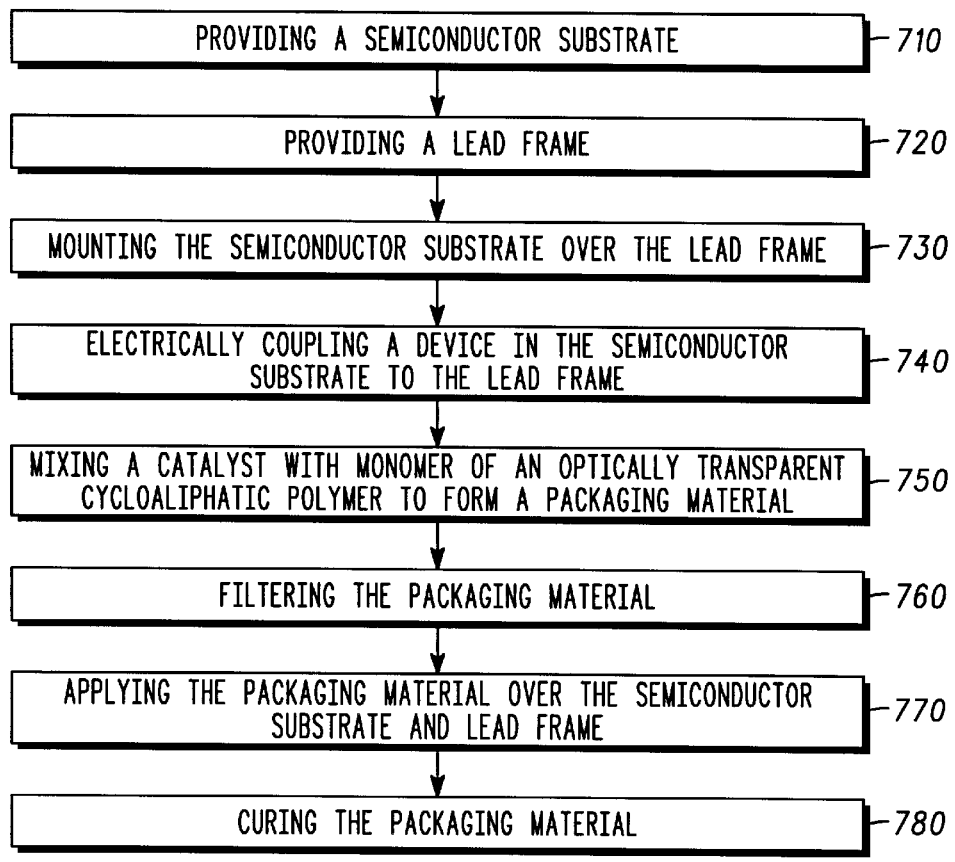

OPTICAL SEMICONDUCTOR COMPONENT AND METHOD OF MANUFACTURE

FIELD OF THE INVENTION

This invention relates, in general, to electronics, and more particularly, to optical semiconductor components and methods of manufacture.

BACKGROUND OF THE INVENTION

Image sensors are used in a wide variety of applications. Image sensors are typically packaged in a cavity of a ceramic substrate, and the cavity is sealed with a glass lid. The substrate and lid are custom parts designed specifically for a particular image sensor. These custom parts and the labor required for their assembly are expensive.

Light Emitting Devices (LEDs) and photodiodes have low-cost packages, but these low-cost packages are not suitable for use with image sensors having high lead counts. Inexpensive silicone gels can be used as a packaging material for image sensors, but silicone gels have a low glass transition temperature, a high coefficient of thermal expansion, and are contaminating. These detrimental characteristics render silicone gels as non-suitable packaging materials for image sensors. Inexpensive epoxies can also be used as packaging materials for image sensors, but epoxies have a high modulus and poor optical conduction. These detrimental qualities render epoxies as non-suitable packaging materials for image sensors.

Accordingly, a need exists for an optical semiconductor component having a low cost package and method of manufacturing such an optical semiconductor component. In addition to being inexpensive, the packaging material in the optical semiconductor component should have a low modulus, a high glass transition temperature, a low coefficient of thermal expansion, non-contaminating characteristics, and high optical transparency.

BRIEF DESCRIPTION OF THE DRAWINGS

The invention will be better understood from a reading of the following detailed description, taken in conjunction with the accompanying drawing figures in which:

FIG. 5 illustrates a chemical diagram of another monomer that can be used during the manufacturing of the optical semiconductor components of FIGS. 1 and 2 in accordance with an embodiment of the invention;

FIG. 6 illustrates a chemical diagram of a polymer comprised of the monomer of FIG. 5 that can be used during the manufacturing of the optical semiconductor components of FIGS. 1 and 2 in accordance with an embodiment of the invention; and FIG. 7 illustrates a flow chart of a method of manufacturing the optical semiconductor components of FIGS. 1 and 2 in accordance with an embodiment of the invention.

Figure 1:
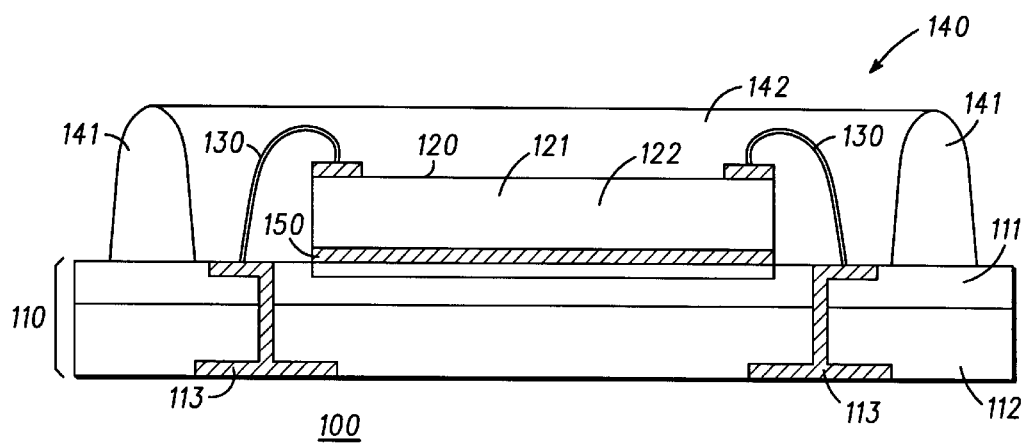
FIG. 1 illustrates a cross-sectional view of an optical semiconductor component in accordance with an embodiment of the invention.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale, and the same reference numerals in different figures denote the same elements.

Furthermore, the terms over, under, and the like in the description and in the claims, if any, are used for descriptive purposes and not necessarily for describing relative positions. It is understood that the terms so used are interchangeable under appropriate circumstances and that the embodiments of the invention described herein are capable of operation in other orientations than described or illustrated herein.

DETAILED DESCRIPTION OF THE DRAWINGS

FIG. 1 illustrates a cross-sectional view of an optical semiconductor component 100. In the preferred embodiment, component 100 is an image sensor integrated circuit component. However, component 100 can also be an image transmitter integrated circuit component, an image sensor discrete component, or an image transmitter discrete component.

Component 100 includes a lead frame 110. Lead frame 110 can include a plurality of electrically insulative layers, such as layers 111 and 112. Lead frame 110 further includes a plurality of electrically conductive traces 113. In the preferred embodiment, traces 113 are located at opposite sides of lead frame 110 and also extend through lead frame 110. As an example, lead frame 110 can also be comprised of other substrate materials such as ceramics, copper, adhesive tape, and/or Printed Circuit Board (PCB) materials.

Component 100 also includes a semiconductor substrate 120 mounted over lead frame 110. Substrate 120 includes at least one semiconductor layer. Substrate 120 can also include a plurality of dielectric and metal layers. A die attach or solder layer 150 can be used to attach substrate 120 to lead frame 110.

An optical image device 121 is supported by substrate 120. Device 121 can be an optical image sensor or an optical image transmitter. An optional integrated circuit 122 can also be supported by substrate 120 and located adjacent to optical image device 121. Integrated circuit 122 can be electrically coupled to device 121.

Component 100 further includes wire bonds 130 located over and coupled to substrate 120. Wire bonds 130 electrically couple optical image device 121 and optional integrated circuit 122 to lead frame 110. Wire bonds 130 can also electrically couple optical image device 121 to integrated circuit 122, or device 121 and integrated circuit 122 can be electrically coupled together using on-chip metallization. In a different embodiment, wire bonds 130 are replaced by flip-chip or solder bumps.

Component 100 further includes an electrically insulative packaging material 140. Packaging material 140 can be comprised of an optically transparent cycloaliphatic polymer 142 and a dam 141. Polymer 142 is located over or covers substrate 120, optical image device 121, optional integrated circuit 122, and at least a portion of lead frame 110. Optical image device 121 is capable of detecting or transmitting a light signal or optical image through polymer 142. Dam 141 is located over or covers a portion of lead frame 110 and is located around a periphery of polymer 142 to contain polymer 142 within a predetermined area over lead frame 110. Dam 141 is comprised of conventional materials and applied to lead frame 110 using ordinary processes as is well known in the art.

Polymer 142 encapsulates wire bonds 130 and protects optical image device 121, integrated circuit 122, and wire bonds 130 from corrosion or contamination by moisture or the like and from physical damage by impact or the like. In a different embodiment, polymer 142 only covers optical image device 121, does not cover integrated circuit 122, and does not encapsulate wire bonds 130. In this different embodiment, dam 141 can cover and protect integrated circuit 122 and wire bonds 130, or a different filler or dam material can be used for that purpose.

Polymer 142 preferably has a modulus of less than approximately 20 MegaPascals (MPa) to reduce a stress level of the polymer, a Coefficient of Thermal Expansion (CTE) of less than approximately 60 parts per million per degrees Celsius to reduce the CTE mismatch between polymer 142 and substrate 120, and an optical transparency of at least 90 percent within or throughout the visible spectrum to improve the optical efficiency of component 100. The visible spectrum includes light having a wavelength of approximately 400 to 700 nanometers. Polymer 142 also preferably has a glass transition temperature of greater than approximately 150 degrees Celsius to be compatible with conventional assembly processes, and the precursor of polymer 142 further preferably has a viscosity of less than approximately 100 centiPoise (cP) to provide a self-leveling quality compatible with screen printing, glob top processing, individual and matrix cavity filing, stenciling and other packaging techniques. Polymer 142 also has a low level of impurities to be non-contaminating.

Optically transparent cycloaliphatic polymer 142 is comprised of a bicyclic compound having at least seven carbon atoms. As an example, the bicyclic compound can have approximately seven to twelve carbon atoms. In the preferred embodiment, the bicyclic compound comprises only seven to eight carbon atoms.

Figure 2:
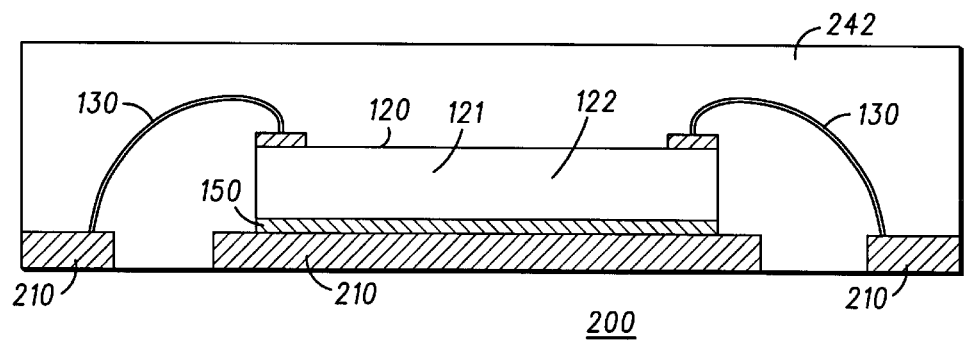
FIG. 2 illustrates a cross-sectional view of another optical semiconductor component in accordance with an embodiment of the invention.

FIG. 2 illustrates a cross-sectional view of an optical semiconductor component 200, which is a different embodiment of component 100 in FIG. 1. Component 200 in FIG. 2 includes a lead frame 210, which preferably consists solely of a stamped, metal lead frame. Component 200 also includes substrate 120, optical image device 121, and optional integrated circuit 122. Component 200 further includes solder layer 150, which attaches substrate 120 to lead frame 210. Component 200 additionally includes an electrically insulative packaging material or optically transparent cycloaliphatic polymer 242. Polymer 242 of FIG. 2 is similar to polymer 142 of FIG. 1. In the preferred embodiment, lead frame 210 and packaging material or polymer 242 form an optical, Quad Flat-pak, No-lead or lead-less (QFN) package.

Figure 3:
FIG. 3 illustrates a chemical diagram of a monomer that can be used during the manufacturing of the optical semiconductor components of FIGS. 1 and 2 in accordance with an embodiment of the invention.

FIG. 3 illustrates a chemical diagram of a monomer 300 that can be used during the manufacturing of optical semiconductor components 100 and 200 of FIGS. 1 and 2, respectively. Monomer 300 is an optically transparent cycloaliphatic monomer that is comprised of a bicyclic compound having seven carbon atoms. Two of the carbon atoms are joined or coupled together by a double bond. In addition to the bicyclic compound, the optically transparent cycloaliphatic monomer of monomer 300 can also include an alkyl chain having one to sixteen carbon atoms. When present in monomer 300, the alkyl chain, represented by the letter "R" in FIG. 3, replaces one of the hydrogen atoms connected to one of the seven carbon atoms in the bicyclic compound. In the preferred embodiment, monomer 300 is referred to as norbornene. The norbornene monomer is available from BF Goodrich of Cleveland, Ohio.

Figure 4:
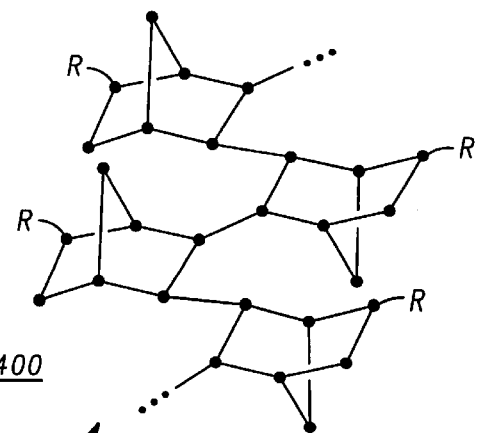
FIG. 4 illustrates a chemical diagram of a polymer comprised of the monomer of FIG. 3 that can be used during the manufacturing of the optical semiconductor components of FIGS. 1 and 2 in accordance with an embodiment of the invention.

FIG. 4 illustrates a chemical diagram of a polymer 400. Polymer 400 is used during the manufacturing of optical semiconductor components 100 and 200 in FIGS. 1 and 2, respectively. As an example, polymer 400 can be used for polymer 142 in FIG. 1 and polymer 242 in FIG. 2. Polymer 400 in FIG. 4 is comprised of a plurality of monomers, such as monomer 300 of FIG. 3. In the preferred embodiment, polymer 400 is referred to as polynorbornene.

FIG. 5 illustrates a chemical diagram of another monomer 500 that can be used during the manufacturing of optical semiconductor components 100 and 200 of FIGS. 1 and 2, respectively. Monomer 500 is an optically transparent cycloaliphatic monomer comprised of a bicyclic compound having eight carbon atoms. Two of the eight carbon atoms are joined or coupled together with a double bond. In addition to the bicyclic compound, the optically transparent cycloaliphatic monomer of monomer 500 can also include an alkyl chain having one to sixteen carbon atoms. When present in monomer 500, the alkyl chain, represented by the letter "R" in FIG. 5, replaces one of the hydrogen atoms connected to one of the eight carbon atoms in the bicyclic compound. In the preferred embodiment, monomer 500 is referred to as bicyclo[2.2.2]oct-2-ene.

FIG. 6 illustrates a chemical diagram of a polymer 600. Polymer 600 can be used during the manufacturing of optical semiconductor components 100 and 200 of FIGS. 1 and 2, respectively. As an example, polymer 600 can be used for polymer 142 in FIG. 1 and polymer 242 in FIG. 2. Polymer 600 in FIG. 6 is comprised of a plurality of monomers, such as monomer 500 of FIG. 5. In the preferred embodiment, polymer 600 is referred to as polybicyclo[2.2.2]oct-2-ene.

FIG. 7 illustrates a flow chart of a method 700 of manufacturing an optical semiconductor component 100 such as component 100 of FIG. 1. At a step 710 of method 700, a semiconductor substrate is provided, and at a step 720 of method 700, a lead frame is provided. At a step 730, the semiconductor substrate is mounted over the lead frame. At a step 740, a device or circuit in the semiconductor substrate is electrically coupled to the lead frame. In one embodiment, steps 730 and 740 can be performed simultaneously with each other. For example, the assembly of a flip-chip device onto a lead frame will perform steps 730 and 740 simultaneously with each other.

Next, at a step 750, a monomer of an optically transparent cycloaliphatic monomer is mixed with a catalyst to create or form a polymer precursor. The polymer precursor is a mixture forming at least a portion of a packaging material. As an example, the mixing of step 750 can be accomplished by using a swirling technique at room temperature. The monomer is comprised of a bicyclic compound having at least seven carbon atoms such as, for example, norbornene or polybicyclo[2.2.2]oct-2-ene derivatives. The catalyst can be comprised of materials such as Ziegler-Natta catalysts based on a 2:5 mole ratio of titanium tetrachloride-trialkyl aluminum ($TiCl_4$—$R_3Al$), a 1:2 mole ratio of titanium tetrachloride-dialkyl aluminum chloride ($TiCl_4$—$R_2AlCl$), or ethyl aluminum chloride ($C_2H_5AlCl_2$) with palladium compounds such as Bis(benzonitrile)dichloropalladium(II) ($Pd(C_6H_5CN)_2Cl_2$). Then, at a step 760, the mixture or packaging material is filtered. As an example, the filtering process can use a High Performance Liquid Chromatography (HPLC) grade filter to remove particulates or precipitates greater than 0.1 micrometers in size to improve the optical transparency of the polymer.

Subsequently, at a step 770, the mixture or packaging material is disposed or applied over the semiconductor substrate and at least a portion of the lead frame. The application of the packaging material in step 770 can be performed by stenciling, casting, injection molding, transfer molding, glob top processing, needle dispensing, or the like. Next, at a step 780, the packaging material is cured. As an example, the packaging material can be cured at a temperature of approximately 65 degrees Celsius for approximately 20 minutes, at approximately 160 degrees Celsius for approximately 60 minutes, and then at approximately 200 degrees Celsius for approximately 2 hours. The curing or annealing process can occur in ambient or in a nitrogen atmosphere.

Therefore, an improved optical semiconductor component and method of manufacture is provided to overcome the disadvantages of the prior art. The component has a packaging material that is inexpensive, is non-contaminating, has a low stress level, minimizes the CTE mismatch with the semiconductor substrate, has a high optical transparency, has a high glass transition temperature, and also has a low viscosity. The method of manufacturing and the packaging material are both compatible with a high volume assembly process. Furthermore, the costs and cycle time associated with tooling, manufacturing, and design of new optical semiconductor components is reduced.

Although the invention has been described with reference to specific embodiments, it will be understood by those skilled in the art that various changes may be made without departing from the spirit or scope of the invention. For instance, the numerous details set forth herein such as, for example, the material compositions are provided to facilitate the understanding of the invention and are not provided to limit the scope of the invention. Furthermore, the polymers described herein can be combined with other packaging materials to form multi-layered packages. For example, an optically transparent adhesive can attach a layer of glass to polymer 142 in FIG. 1 or polymer 242 in FIG. 2. In this embodiment, polymers 142 and 242 act as stress buffer layers between the underlying substrate and the overlying adhesive and glass. Accordingly, the disclosure of embodiments of the invention is intended to be illustrative of the scope of the invention and is not intended to be limiting. It is intended that the scope of the invention shall be limited only to the extent required by the appended claims.

What is claimed is:

1. An optical semiconductor component comprising:
   a semiconductor substrate; and
   a packaging material located over the semiconductor substrate and comprised of an optically transparent cycloaliphatic polymer.

2. The optical semiconductor component of claim 1 further comprising:
   wire bonds located over and coupled to the semiconductor substrate,
   wherein:
      the optically transparent cycloaliphatic polymer encapsulates the wire bonds.

3. The optical semiconductor component of claim 1 further comprising:
   an optical image sensor supported by the semiconductor substrate,
   wherein:
      the optical image sensor is capable of detecting an optical image passing through the optically transparent cycloaliphatic polymer.

4. The optical semiconductor component of claim 1 further comprising:
   an optical image transmitter supported by the semiconductor substrate,
   wherein:
      the optical image transmitter is capable of transmitting an optical image through the optically transparent cycloaliphatic polymer.

5. The optical semiconductor component of claim 1 further comprising:
   an optical image device supported by the semiconductor substrate; and
   an integrated circuit supported by the semiconductor substrate and located adjacent to the optical image device.

6. The optical semiconductor component of claim 5 wherein:
   the integrated circuit is electrically coupled to the optical image device; and
   the optically transparent cycloaliphatic polymer is located over the integrated circuit.

7. The optical semiconductor component of claim 1 further comprising:
   an optical image device supported by the semiconductor substrate,
   wherein:
      the optically transparent cycloaliphatic polymer covers and protects the optical image device.

8. The optical semiconductor component of claim 1 wherein:
   the optically transparent cycloaliphatic polymer has a modulus of less than approximately 20 MegaPascals and a coefficient of thermal expansion of less than 60 parts per million per degree Celsius.

9. The optical semiconductor component of claim 1 wherein:
   the optically transparent cycloaliphatic polymer has an optical transparency of at least 90 percent throughout a visible spectrum.

10. The optical semiconductor component of claim 1 wherein:
    the optically transparent cycloaliphatic polymer comprises a bicyclic compound comprising at least seven carbon atoms.

11. The optical semiconductor component of claim 10 wherein:
    the bicyclic compound comprises only seven to eight carbon atoms and a plurality of hydrogen atoms.

12. The optical semiconductor component of claim 11 wherein:
    the optically transparent cycloaliphatic polymer further comprises an alkyl chain coupled to the bicyclic compound.

13. The optical semiconductor component of claim 1 wherein:
    the optically transparent cycloaliphatic polymer is comprised of polynorbornene.

14. The optical semiconductor component of claim 1 wherein:
    the optically transparent cycroaliphatic polymer is comprised of polybicyclo[2.2.2]oct-2-ene.

15. An image sensor integrated circuit component comprising:
    a lead frame;
    a semiconductor substrate mounted over the lead frame;
    an optical image sensor supported by the semiconductor substrate; and
    a packaging material comprised of an optically transparent cycloaliphatic polymer and covering the semiconductor substrate, the optical image sensor, and at least a portion of the lead frame,
    wherein:
        the optical image sensor is capable of detecting an optical image passing through the optically transparent cycloaliphatic polymer.

16. The image sensor integrated circuit component of claim 15 further comprising:
    wire bonds coupling the optical image sensor to the lead frame,
    wherein:
        the optically transparent cycloaliphatic polymer encapsulates the wire bonds and protects the optical image sensor and the wire bonds from contamination and physical damage.

17. The image sensor integrated circuit component of claim 15 wherein:
    the lead frame and the packaging material form an optical, quad flat-pak, lead-less package.

18. The image sensor integrated circuit component of claim 15 wherein:
    the optically transparent cycloaliphatic polymer has a modulus of less than approximately 20 MegaPascals, a glass transition temperature of greater than approximately 150 degrees Celsius, a coefficient of thermal expansion of less than 60 parts per million per degree Celsius, an optical transparency of at least 90 percent throughout a visible spectrum, and a viscosity of less than approximately 100 centiPoise.

19. The image sensor integrated circuit component of claim 15 wherein:
    the optically transparent cycloaliphatic polymer comprises a bicyclic compound having seven to twelve carbon atoms.

20. The image sensor integrated circuit component of claim 15 wherein:
    the optically transparent cycloaliphatic polymer is comprised of a material selected from the group consisting of polynorbornene and polybicyclo[2.2.2]oct-2-ene.

21. A method of manufacturing an optical semiconductor component comprising:
    providing a semiconductor substrate; and
    disposing a packaging material over the semiconductor substrate and comprised of an optically transparent cycloaliphatic polymer.

22. The method of claim 21 further comprising:
    mixing a monomer of the optically transparent cycloaliphatic polymer with a catalyst to create at least a portion of the packaging material.

23. The method of claim 22 further comprising:
    providing the catalyst comprised of a Ziegler-Natta catalyst; and
    providing the monomer comprised of a bicyclic compound having at least seven carbon atoms.

24. The method of claim 22 further comprising:
    providing the monomer comprised of a material selected from the group consisting of norbornene and bicyclo[2.2.2]oct-2-ene.

25. The method of claim 22 further comprising:
    filtering the packaging material.

26. The method of claim 25 wherein:
    disposing the packaging material further comprises:
        applying the packaging material over the semiconductor substrate after filtering the packaging material.

27. The method of claim 26 further comprising:
    curing the packaging material after applying the packaging material.

28. The method of claim 22 further comprising:
    mounting the semiconductor substrate over a lead frame,
    wherein:
        disposing the packaging material further comprises:
            applying the packaging material over at least a portion of the lead frame; and
            forming an optical, quad flat-pak, lead-less package.

29. The method of claim 22 further comprising:
    curing the packaging material.

* * * * *

INTER PARTES REEXAMINATION CERTIFICATE (0123rd)

United States Patent
Daniels et al.

(10) Number: US 6,303,978 C1
(45) Certificate Issued: Dec. 15, 2009

(54) OPTICAL SEMICONDUCTOR COMPONENT AND METHOD OF MANUFACTURE

(75) Inventors: Dwight L. Daniels, Mesa, AZ (US); Treliant Fang, Chandler, AZ (US); Athena M. Parmenter, Fountain Hills, AZ (US)

(73) Assignee: Motorola, Inc., Schaumburg, IL (US)

Reexamination Request:
No. 95/000,054, Oct. 13, 2004

Reexamination Certificate for:
Patent No.: 6,303,978
Issued: Oct. 16, 2001
Appl. No.: 09/627,029
Filed: Jul. 27, 2000

(51) Int. Cl.
*H01L 23/31* (2006.01)
*H01L 23/29* (2006.01)
*H01L 23/16* (2006.01)
*H01L 23/28* (2006.01)
*H01L 23/24* (2006.01)

(52) U.S. Cl. ............ 257/642; 257/E23.119; 257/792; 257/795; 257/643; 257/680; 257/702; 257/E23.14; 257/E23.124; 438/116

(58) Field of Classification Search .......... 257/642, 257/643, 680, 702, 792, 795; 438/116
See application file for complete search history.

(56) References Cited

U.S. PATENT DOCUMENTS

| | | | | |
|---|---|---|---|---|
| 5,461,425 A | * | 10/1995 | Fowler et al. | 348/294 |
| 5,973,337 A | * | 10/1999 | Knapp et al. | 257/99 |
| 6,252,252 B1 | * | 6/2001 | Kunii et al. | 257/81 |
| 6,335,548 B1 | * | 1/2002 | Roberts et al. | 257/98 |
| 6,393,183 B1 | * | 5/2002 | Worley | 385/39 |
| 6,455,650 B1 | * | 9/2002 | Lipian et al. | 526/171 |
| 6,627,872 B1 | * | 9/2003 | FuKamura et al. | 250/239 |

FOREIGN PATENT DOCUMENTS

| | | | |
|---|---|---|---|
| JP | HEI 3-224255 | * | 10/1991 |
| JP | HEI 3-237749 | * | 10/1991 |
| WO | WO 00/20472 | * | 4/2000 |

* cited by examiner

*Primary Examiner*—Erik Kielin

(57) ABSTRACT

An optical semiconductor component includes a semiconductor substrate (120) and a packaging material (140) located over the semiconductor substrate. The packaging material includes an optically transparent cycloaliphatic polymer (142, 242, 400, 600). A method of manufacturing the component includes nixing a monomer (300, 500) of the polymer with a catalyst to form the packaging material, filtering the packaging material, applying the packaging material, and curing the packaging material.

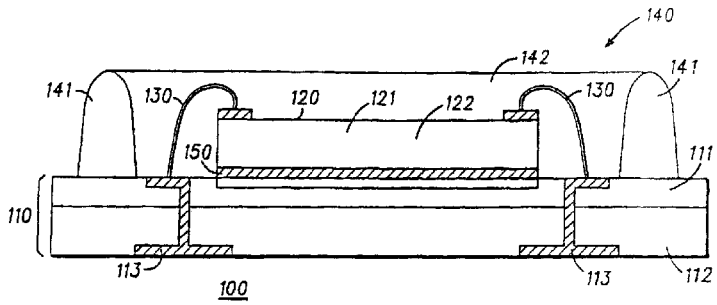
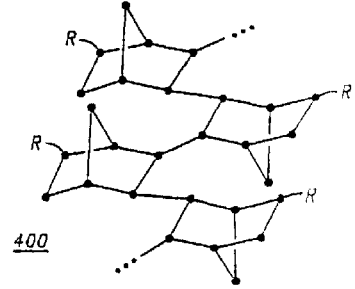

INTER PARTES REEXAMINATION CERTIFICATE ISSUED UNDER 35 U.S.C. 316

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1–29 are cancelled.

New claims 30–36 are added and determined to be patentable.

*30. An optical semiconductor component comprising:*
*a semiconductor substrate; and*
*a packaging material comprised of an optically transparent cycloaliphatic polymer derived, at least in part, from a bicyclo[2.2.2]oct-2-ene monomer, such packaging material located over the semiconductor substrate and having a modulus of less than 20 MegaPascals and a coefficient of thermal expansion of less than 60 parts per million per degree Celsius.*

*31. An optical semiconductor component comprising:*
*a semiconductor substrate;*
*an optical image device supported by the semiconductor substrate;*
*an integrated circuit, adjacent to the optical image device, supported by the semiconductor substrate; and*
*a packaging material comprised of an optically transparent cycloaliphatic polymer located over the semiconductor substrate and covering only the optical image device, wherein the optically transparent cycloaliphatic polymer has a modulus of less than 20 MegaPascals and a coefficient of thermal expansion of less than 60 parts per million per degree Celsius.*

*32. A method of manufacturing an optical semiconductor component comprising:*
*providing a semiconductor substrate;*
*forming an optically transparent cycloaliphatic polymer by mixing an aluminum and titanium containing Ziegler-Natta catalyst with a monomer useful for forming such optically transparent cycloaliphatic polymer; and*
*disposing the packaging material, comprised of the optically transparent cycloaliphatic polymer, over the semiconductor substrate.*

*33. The method of claim 32, wherein the monomer comprises a bicyclo[2.2.2]oct-2-ene.*

*34. The method of claim 32 further comprising filtering the packaging material.*

*35. The method of claim 32, wherein disposing the packaging material further comprises applying the packaging material over the semiconductor substrate after filtering the packaging material.*

*36. The method of claim 32 further comprising curing the packaging material after applying the packaging material.*

\* \* \* \* \*